United States Patent [19]
Lee et al.

[11] Patent Number: 5,606,196
[45] Date of Patent: Feb. 25, 1997

[54] HIGH-FREQUENCY, HIGH-DENSITY SEMICONDUCTOR CHIP PACKAGE WITH SCREENING BONDING WIRES

[75] Inventors: Hai Y. Lee, Suwon; Kyung S. Lee, Kunpo; Chan M. Han, Yongin-gun, all of Rep. of Korea

[73] Assignee: Samsung Electronics Co., Ltd., Suwon, Rep. of Korea

[21] Appl. No.: 580,719

[22] Filed: Dec. 29, 1995

[30] Foreign Application Priority Data

Oct. 14, 1995 [KR] Rep. of Korea .................. 1995-35522

[51] Int. Cl.[6] .......................... H01L 29/00; H01L 23/552; H01L 23/48
[52] U.S. Cl. .......................... 257/503; 257/659; 257/692; 257/784; 257/786
[58] Field of Search .................................... 257/421, 422, 257/692, 780, 784, 786, 503, 659, 660

[56] References Cited

U.S. PATENT DOCUMENTS

| | | | |
|---|---|---|---|
| 3,838,443 | 9/1974 | Laighton | 357/84 |
| 5,309,019 | 5/1994 | Moline et al. | 257/670 |
| 5,536,906 | 7/1996 | Haas, Jr. et al. | 174/52.4 |

FOREIGN PATENT DOCUMENTS 3-286559  12/1991  Japan ..................... 257/659

OTHER PUBLICATIONS

Lee, Hai–Young et al., "Phenomenological loss equivalence method for planar Quasi–TEM transmission lines with a thin normal conductor or superconductor", *IEEE Transactions on Microwave Theory and Techniques*, vol. 37, No. 12, Dec. 1989.

Stuzman, W. L. et al., "Moment Methods", *Antenna Theory and Design*, John Wiley and Sons, Inc., 1981, pp. 306–371.

Primary Examiner—Ngân V. Ngô
Assistant Examiner—Allan R. Wilson
Attorney, Agent, or Firm—Cushman Darby & Cushman IP Group of Pillsbury Madison & Sutro LLP

[57] ABSTRACT

A semiconductor device package including a semiconductor chip formed with a plurality of bonding pads including at least two multiple-bonding pads to which identical signals are transmitted; a substrate provided with a chip-support and a plurality of conductors for electrically connecting the chip to external devices; a plurality of bonding wires for electrically connecting said bonding pads to the conductors including multiple-bonding wires for electrically connecting the multiple-bonding pads to corresponding conductors; and a current looper for screening magnetic fields generated from the bonding wires so that the magnetic fields cannot interfere each other, the current looper being located between the multiple-bonding wires and bonded to the substrate at both ends.

20 Claims, 9 Drawing Sheets

HIGH-FREQUENCY, HIGH-DENSITY SEMICONDUCTOR CHIP PACKAGE WITH SCREENING BONDING WIRES

BACKGROUND OF THE INVENTION

1. Field of the Invention

The present invention relates generally to a semiconductor device package, and in particular to a semiconductor device package structure which permits a significant decrease in package parasitic effects such as inductance and crosstalk.

2. Description of the Related Arts

For the assembly of plastic packages, wire bonding techniques are widely used in fabrication of integrated circuits since wiring banding can assure a higher reliability and a lower production cost of semiconductor packages compared with other chip connection techniques such as TAB(tape automated bonding) or Flip-Chip Bonding techniques. Recent advances in integration technology and performance of integrated circuits have achieved increased speed and band-width, and made possible a greater integration density and multi-chip interconnections of integrated devices. For high speed and high density ICs such as micro/millimeter-wave integrated circuit (MMIC) or optoelectronic integrated circuit (OEIC) ICs, wire bonding parasitic effects caused by inductance or interference between bonding wires connecting the device to the lead frame become dominant. Such parasitic effects are more severe at high frequencies, and there are interference, deformation and parasitic effects caused within high frequency components even for low frequency devices.

In particular, for the MMIC using compound semiconductor devices made from, for example GaAs, since the inductance of the lead frame is as small as ⅕–⅒ of the that of bonding wires, the electric property of the bonding wires has a more important role in improving high frequency characteristics of the semiconductor device packages. Further, multiple-bonding techniques in which the wires of the ground I/O pins and bypass I/O pins are interconnected to each other in parallel in order to accomplish dissipation of heat generated from simultaneous application of alternative and direct currents to the bonding wires, as well as to accomplish strong bonding between the wires and the device. However, although the multiple-bonding wires are advantageous over single-bonding wires in the light of greater reduction in the current density and better heat dissipation, provision of multiple bonding wires gives no satisfactory reduction in the impedance level, since the mutual inductance increases as the pitch between bonding wires becomes fine. The unsatisfactory reduction in the impedance level may be attributed by the mutual magnetic coupling of neighboring bonding wires, which is increasing at high frequency and may cause crosstalk and eventually erroneous operation of devices. If the pitch or distance between bonding wires is increased in order to avoid such crosstalk, the integration density becomes lowered. Accordingly, crosstalk of bonding wires of high-frequency and high-density integrated circuits had been believed to be inevitable.

FIG. 1 is a perspective view of double bonding wire modeling system for the electric characterization of the conventional multiple-bonding wire structure. On the assumption that the ground plane (2) is perfectly grounded, a substrate (4) of 400 μm thickness is attached thereonto. The substrate (4) is provided with double-bonding pads (6) for the ball-bonding of the wires (8a) (8b) on its upper surface. Gold wires (8a, 8b) of 25 μm diameter and 2 mm length are bonded to the bonding pads (6) at one end and to the ground plane (2) at the other end by using a ball-bonding machine. The distance between the bonding wires (8a) and (8b) is 200 μm. Voltage sources (V1) and (V2) are connected between the bonding wires (8a), (8b) and the ground plane (2), respectively to measure mutual magnetic coupling of the bonding wires and (8b).

The ground plane may be replaced with imaginary bonding wires, according to image theory. To take into account effects of conductor loss of bonding wires, caused by a radiation effect, the internal resistance calculated by using "phenomenological loss equivalence method" [H. Y. Lee, T. Itoh, "Phenomenological loss equivalence method for planar Quasi-TEM transmission lines with a thin normal conductor or superconductor" IEEE Trans. Microwave Theory and Tech., Vol. 37, No. 12, December 1989] is inputted equivalently into the analytically divided wires [Method of Moments (MoM)[W. L. Stuzman and G. A. Thiel, "Antenna Theory and Design", John Wiley and Sons, Inc., 1981] using the lumped element loading method. The self and mutual inductances (L, M) of bonding wires are calculated from the values of input impedance (Ze) when in-phase voltage (V1=1[V], V2=1[V]) is applied to the individual bonding wires and of input impedance (Zo) and radian frequency (ω) when voltage supply having a phase difference of 180 degree (V1=1[V], V2=1[V]) is applied to the individual bonding wires.

$$L = Im\ (Ze+Zo)/2\omega \qquad (1)$$

$$M = Im\ (Ze-Zo)/2\omega \qquad (2)$$

The relationship between radius (a) of bonding wires, the height (h) from the ground plane to the highest point of bonding wire, distance (d) between individual bonding wires and static mutual inductance (M) is as follows:

$$\text{Static } M = 0.1 \ln\{1+(2h/d)^2\} \qquad (3)$$

Here, the impedance Z of bonding wire is expressed by following matrix equations:

$$Z_{m,n} = (1/j4\pi\omega\epsilon)\Big\{\ \omega^2\epsilon\mu[\vec{s_m}\cdot\hat{s_n}]\psi_{m,n-1/2,n+1/2} - \\ \frac{1}{(S_{n+1}-S_n)}\ [\psi_{m+1/2,n,n+1}-\psi_{m-1/2,n,n+1}] + \\ \frac{1}{(S_n-S_{n-1})}\ [\psi_{m+1/2,n-1,n}-\psi_{m-1/2,n-1,n}]\ \Big\} \qquad (4)$$

(herein, the kernels ($\psi_{m,\ p,\ q}=\int k\ (S_m-S')ds'$, and $k(s-s')$) are represented by the integration of whole wire circumference; and s' and s are the source and the field points on the wire axis.)

As can be seen from the equations (1), (2) and (4), the self and mutual inductances (L, M) proportionally increase, depending on the frequency due to an increase in the radiation effect at high frequency. The increase in the mutual inductance (M) may cause crosstalk between individual bonding wires, which consequently causes erroneous operation of elements, as can be seen from the following equation (5):

$$\text{Crosstalk } [dB] = 20\ \log\ (M/L) \qquad (5)$$

Of course, the crosstalk may be avoided by increasing the distance (d), since the mutual inductance (M) is inversely proportional to the distance (d), as shown in equation (3). However, an increase in the distance (d) eventually lowers, integration density of the semiconductor device packages.

SUMMARY OF THE INVENTION

Thus, an object of the invention is to provide an optimized structure of bonding wires for high density and high speed semiconductor device packages, which permits a significant reduction of the crosstalk of bonding wires while causing no damage to the integration density.

This object can be accomplished by a semiconductor device package, comprising a semiconductor chip formed with a plurality of bonding pads including at least two multiple-bonding pads to which signals are transmitted;

a substrate provided with a chip-support and a plurality of conductor for electrically connecting the chip to external devices;

a plurality of bonding wires for electrically connecting the bonding pads to conductors including multiple-bonding wires for electrically connecting the multiple-bonding pads to corresponding conductors; and a current looper for screening magnetic fields generated from the bonding wires so that the magnetic fields cannot interfere with each other, these current loopers being located between the multiple-bonding wires and bonded to the substrate at both ends.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF PREFERRED EMBODIMENTS OF THE INVENTION

The present invention will now be described in more detail with reference to accompanying drawings.

For the present invention, it is possible to effectively reduce bonding wire parasitic effects such as inductance and crosstalk of high-frequency and high-density semiconductor device-packages by providing screening bonding wires between individual bonding wires carrying signals and grounding them to the substrate of the package.

Figure 1:
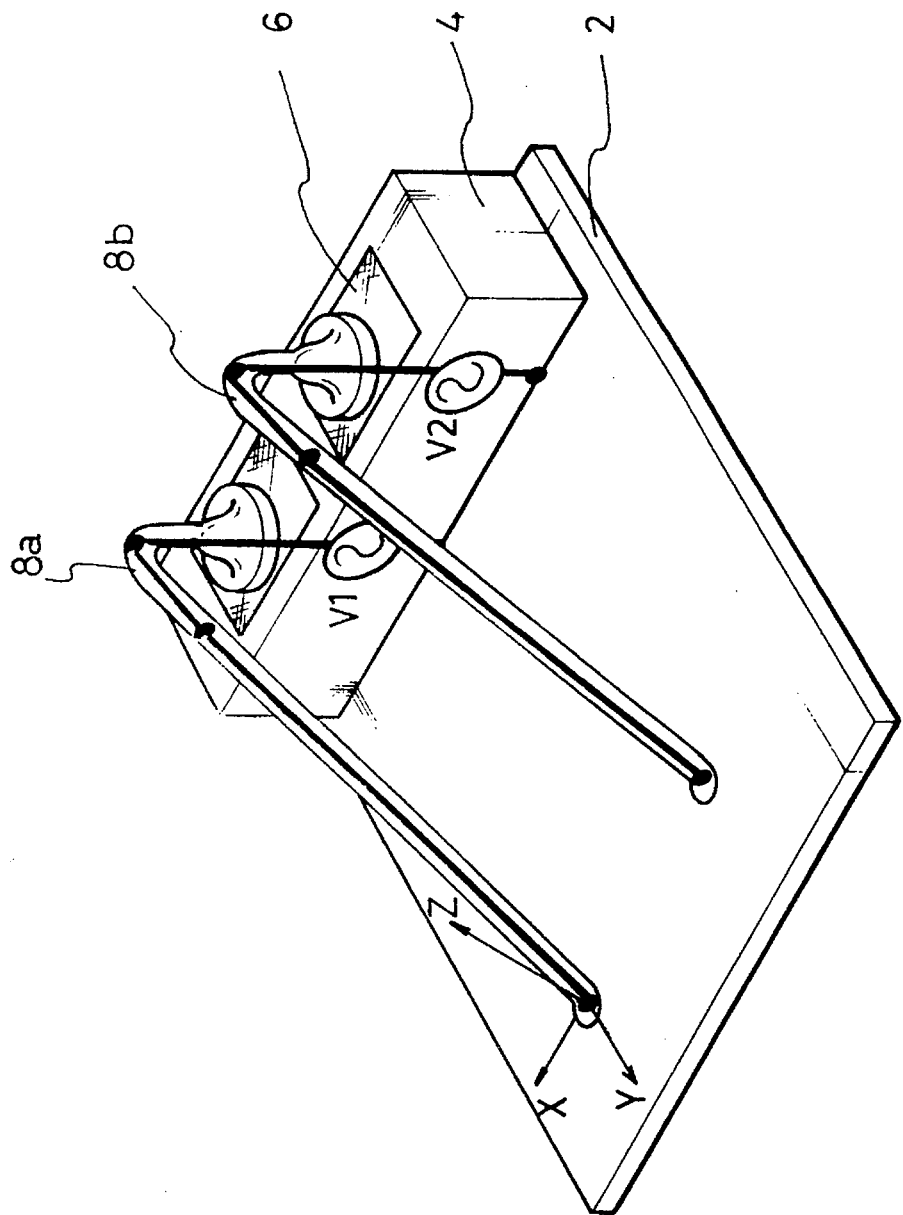
FIG. 1 is a perspective view of a double bonding wire modeling system for the electric characterization of conventional multiple bonding wire structure.
Figure 2:
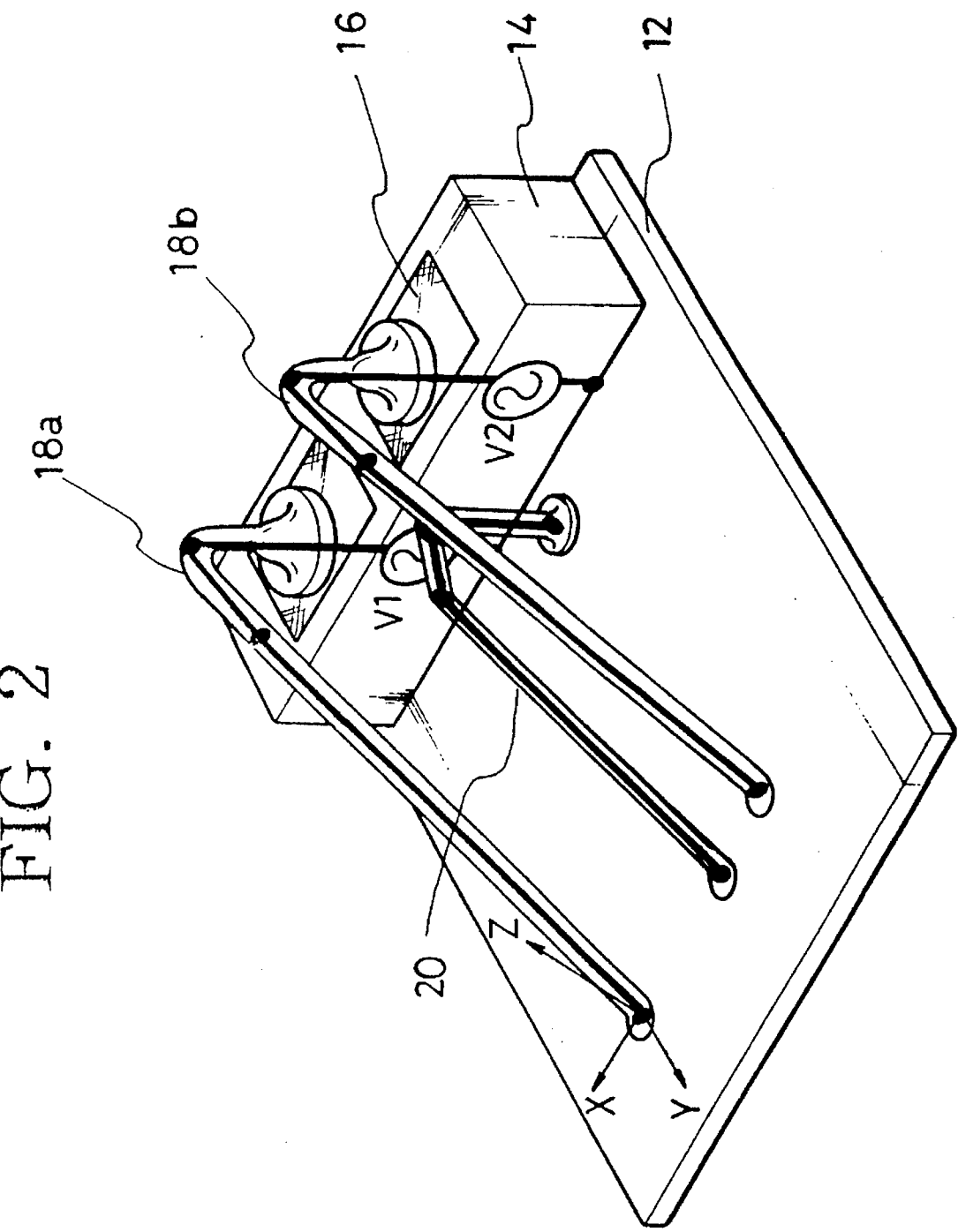
FIG. 2 is a perspective view of a double bonding wire modeling system for the electrical characterization of bonding wires for semiconductor devices having a bonding wire structure provided with a screening bonding wire according to the present invention.

FIG. 2 is a perspective view of a double bonding wire modeling system for the electrical characterization of bonding wires for semiconductor devices with multiple bonding wires including a screening bonding wire according to the present invention. To facilitate the explanation in comparison with the modeling system of the conventional bonding wire structure shown in FIG. 1, a ground plane (12), a substrate (14), bonding pads (16) and double bonding wires (18a, 18b), all of which have the same dimension and shape, are employed.

To optimize the bonding wire structure according to the present invention, the modeling system shown in FIG. 2 comprises a screening bonding wire (20), which is placed between two bonding wires (18a, 18b) and bonded to the ground plane at both ends. The bonding wires (18a, 18b) for transmitting the signal are bonded to the ground plane at one end, and to the bonding pads (16) at the other end. The self and mutual inductances of the system are calculated from the equations (1)–(3), and the crosstalks of bonding wires (18a, 18b) are obtained from these inductances.

Since both ends of the screening bonding wires (20) are bonded to the ground plane (12), the current through the screening bonding wire (20) forms a closed loop by virtue of the magnetic field generated by a time-varying electric field at the bonding wires (18a, 18b). Thus, mutual inductance can be reduced. The reduction in the inductance and crosstalk levels accomplished by the bonding wire structure according to the present invention can be seen from the graphs in FIGS. 3 and 4.

Figure 3:
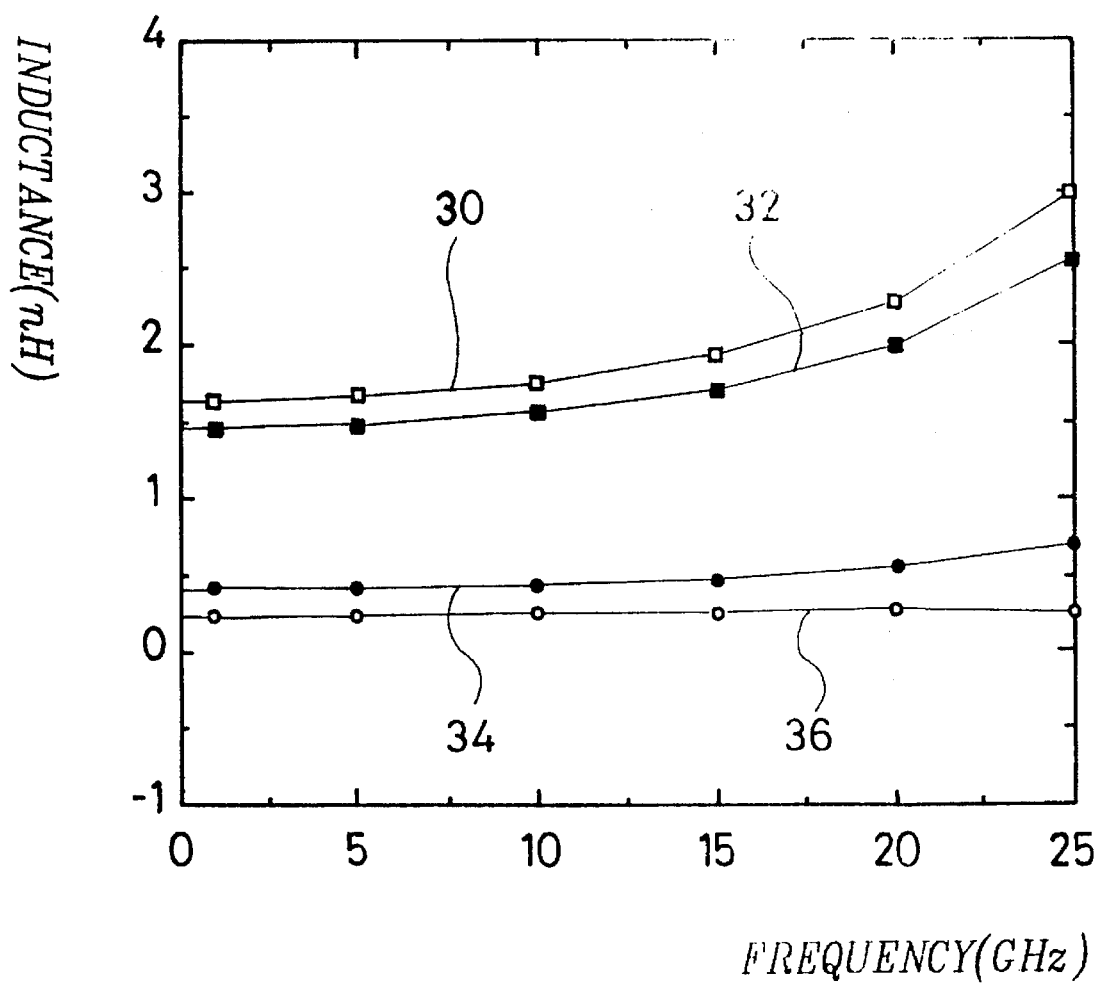
FIG. 3 is a graph showing the reductions in self and mutual inductances of semiconductor devices having a bonding wires structure provided with a screening bonding wire according to the present invention.

FIG. 3 is a graph showing the reductions in the self and mutual inductances of the semiconductor devices with the bonding wire structure provided with a screening bonding wire according to the present invention. With reference now to FIG. 3, the lines 30 and 34 indicate the self and mutual inductances of the conventional multiple bonding wire structure, respectively, while the lines 32 and 36 indicate the self and mutual inductances of the bonding wire structure provided with a screening bonding wire according to the present invention. The self inductance (line 30) of the conventional structure, and the mutual inductance (32) and self inductance (line 36) of the structure provided according to the invention increase depending on the frequency by virtue of a conductor loss-induced increase in the radiation effect. The self and mutual inductances of the structure provided according to the invention (lines 32 and 34) is lower than those of the conventional structure (lines 30 and 34). The reason is as follows: The input impedance Zo values of the lines 32 and 36 are more rapidly decreased when compared with those of the lines 30 and 34, since the induced current of the screening bonding wire (20) has a component having a direction opposite to the induced current of bonding wires (18a, 18b) when in-phase voltages are supplied, while the Zo values of the lines 30 and 34 becomes identical to those of the lines 32 and 36, since the total current induced at the screening bonding wire (20) becomes zero(0) because the current induced by the voltage V1 by action of the screening bonding wire (20) is offset by the current induced by the voltage V2 by action of the screening bonding wire (20) when an inverse phase power is supplied. To the contrary, the mutual inductance of the lines 32 and 36 increase depending on the number of frequency below 20 GHz. At a frequency above 20 GHz, the induced current at the screening bonding wire (20) is greater than those at the bonding wires (18a, 18b) when in-phase voltages are supplied.

Figure 4:
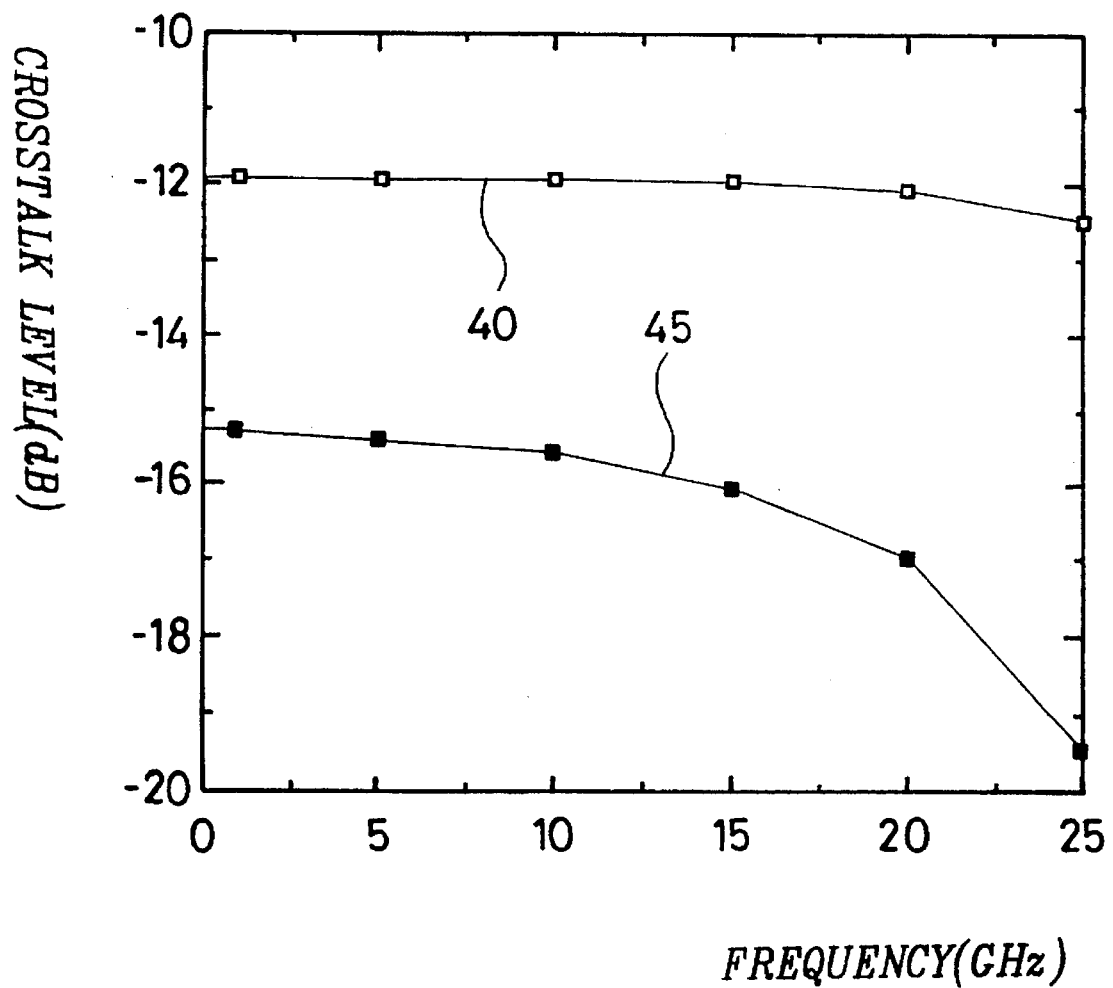
FIG. 4 is a graph showing the reduction in crosstalk level of semiconductor devices having a bonding wire structure provided with a screening bonding wire according to the present invention.

FIG. 4 is a graph showing the reduction of the crosstalk level of the semiconductor devices having a bonding wire structure provided with a screening bonding wire according to the present invention. With reference now to FIG. 4, the line 40 indicates the crosstalk level of the conventional bonding wire structure, and the line 45 indicates the crosstalk level of the bonding wire structure provided in accordance with the principles of the present invention. As can be seen from the equation (5), the crosstalk level is inversely proportional to the self inductance (L) and is proportional to the mutual inductance (M). And, for the lines 30 and 34 in FIG. 3, as the number of frequency becomes larger, the increase in the self inductance is greater than the increase in the mutual inductance. Thus, for the line 40 in FIG. 4 (i.e. the conventional bonding wire structure), the crosstalk level at frequencies above 20 GHz is slightly decreased. To the contrary, for the line 45 in FIG. 4 (i.e., the bonding wire structure according to the present invention), the crosstalk level at frequencies above 20 GHz is abruptly decreased. The reason for this phenomenon is that the current through the screening bonding wire (20) induced by the bonding wires (18a, 18b) forms a magnetic field opposite to the magnetic field of the bonding wires (18a, 18b) so that the increase in the mutual inductance can be inhibited.

Figure 5:
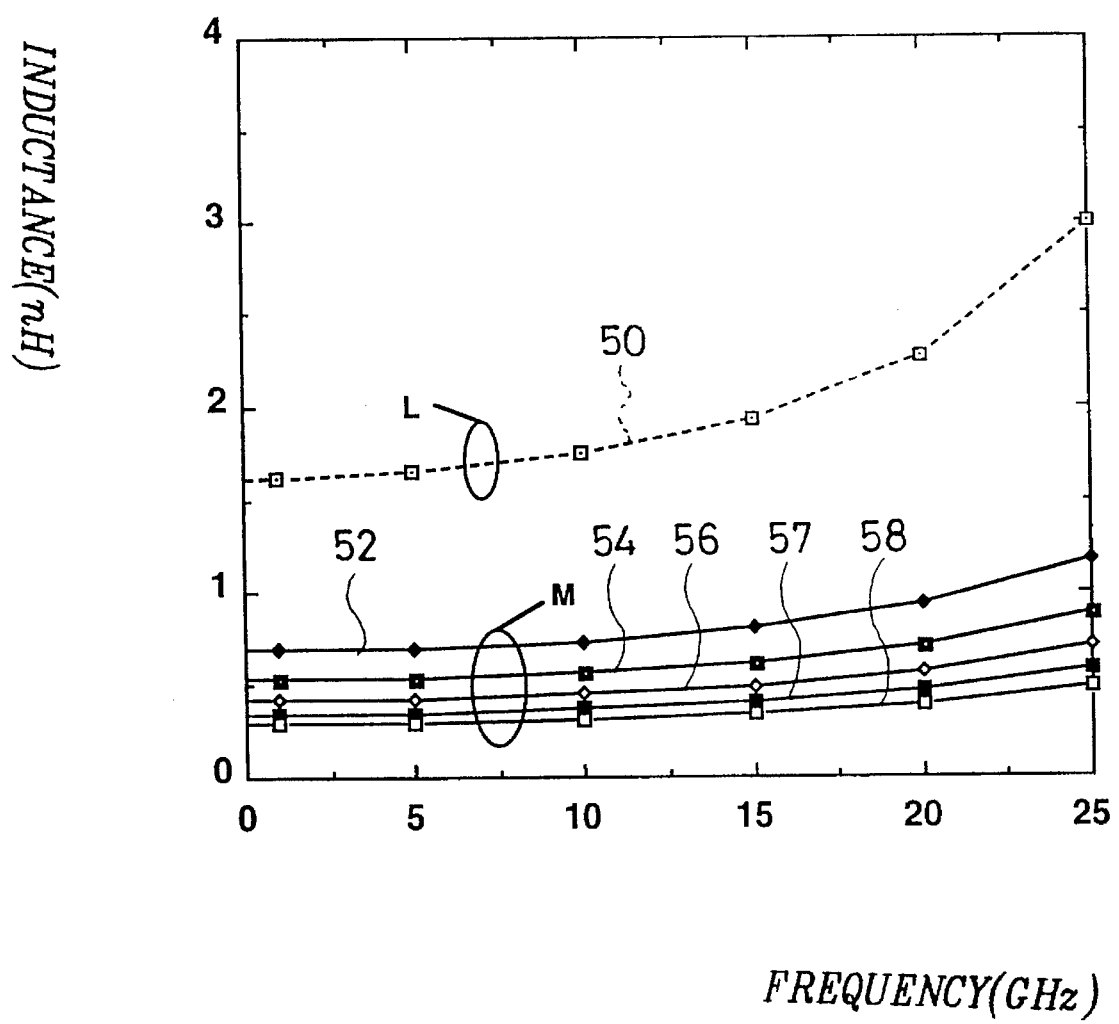
FIG. 5 is a graph showing the changes in inductance depending on the distance (d) between individual multiple-bonding wires of the conventional multiple bonding wire structure.
Figure 6:
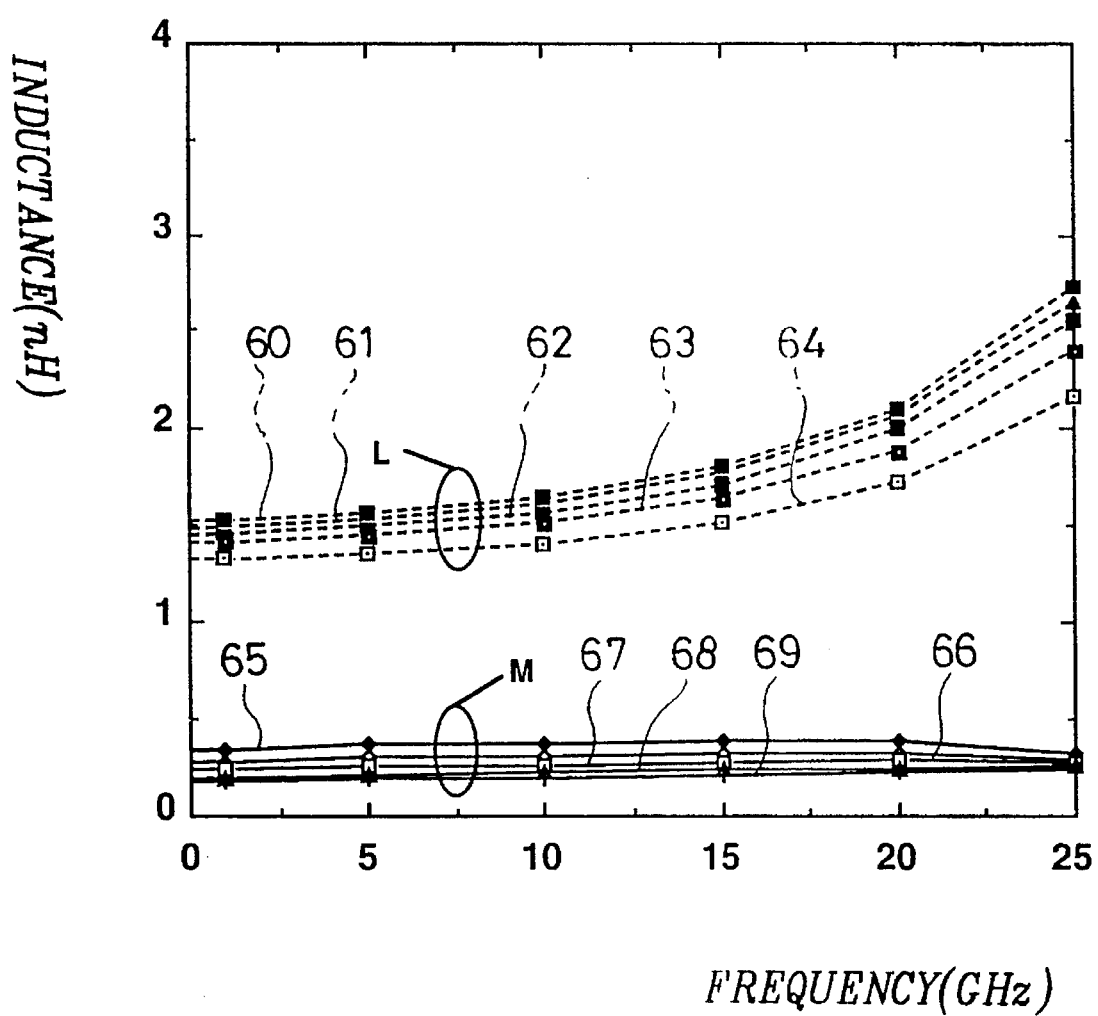
FIG. 6 is a graph showing the changes in inductance depending on the distance (d) between individual multiple-bonding wires of the multiple bonding wire structure having a screening bonding wire according to the present invention.

FIGS. 5 and 6 are graphs showing the changes in the inductance depending on the distance (d) between individual bonding wires of the conventional multiple-bonding wire structure and of the multiple-bonding wire structure having a screening bonding wire provided in accordance with the principles of the present invention, respectively.

With reference now to FIG. 5, the line 50 indicates the self inductance (L) when the distance between the bonding wires (18a, 18b) is in the range from 100 μm to 300 μm, while the lines 52, 54, 56, 57 and 58 indicate the mutual inductances (M) when the distance is 100, 150, 200, 250 and 300 μm, respectively. The mutual inductances (M) become larger as the distance becomes greater, complying with the equation (3). And, the self inductance (L) of the bonding wires (18a, 18b) is not effected by the distance (d).

With reference now to FIG. 6, the lines 60, 61, 62, 63 and 64 indicate the self inductances (L) when the distance is 100, 150, 200, 250, and 300 μm, respectively. These self inductances indicated by the lines 60, 61, 62, 63 and 64 decrease as the distance becomes greater, since the impedance Z changes depending on the distance. For the FIG. 6, the lines 65, 66, 67, 68 and 69 indicate the mutual inductances (M) when the distance is 100, 150, 200, 250 and 300 μm, respectively. The mutual inductances (M) become greater the as the distance becomes smaller.

As described above, the mutual inductance and crosstalk levels can be effectively reduced by providing a screening bonding wire between individual multiple-bonding wires for electrically connecting the semiconductor device to the external devices to form a closed current loop.

The embodiments of semiconductor chip package provided with the screening bonding wires according to the present invention will be described in more detail hereinafter.

Figure 7B:
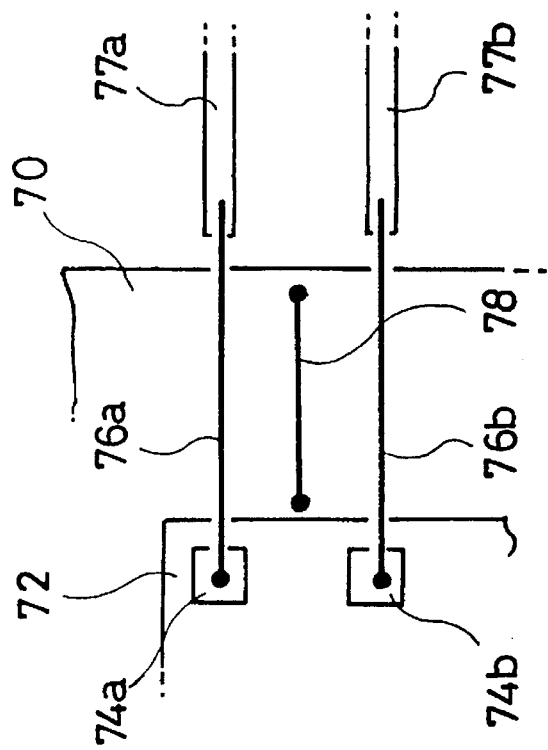
FIG. 7B is a plan view thereof.
Figure 7A:
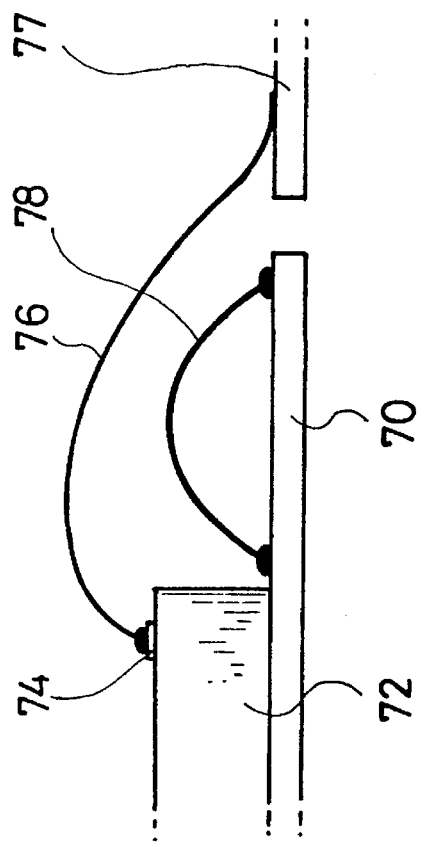
FIG. 7A is a partial cross-sectional view of an embodiment of a semiconductor device package with a screening bonding wire according to the present invention.

FIG. 7A is a partial cross-sectional view of an embodiment of semiconductor device package provided with screening bonding wires according to the present invention, and FIG. 7B is a plan view thereof. With reference to FIG. 7A, a semiconductor chip. (72) is attached onto a chip supporting means (70) such as a die pad of a lead frame, with an epoxy adhesive. The bonding pads (74) formed at upper surface of the chip (72) are connected to leads (77) by way of bonding wires (76). The bonding wires (76) are ball-bonded to the bonding pads (74) at one end, while the other end is wedge-bonded to the lead (77). The wedge-bonding of the bonding wires (76) to the lead (77) is preferable because the inductance of the bonding wires (76) becomes smaller as the height of the wires from the die pad (70) (a grounded plane) becomes smaller. A screening bonding wire (78) is provided between the bonding wires (76) on the chip supporting means (70).

The bonding wire structure is depicted in more detail in FIG. 7B. With reference to FIG. 7B, two bonding pads (74a, 74b) are formed on a surface of the device (72), into which an identical signal is inputted (that is to say, they are multiple-bonding pads), and electrically connected to the leads (77a, 77b) by way of two bonding wires (76a, 76b). A screening bonding wire (78) is provided between the bonding wires (76a, 76b) by ball-bonding both ends thereof to the chip supporting means (70).

It should be borne in mind that the screening bonding wire (78) must form a closed current loop, since an induced current through the screening bonding wire disturbs the magnetic coupling of the bonding wires (76a, 76b) so that the crosstalk of bonding wires can be reduced. Accordingly, the chip supporting means (70) should be made from a conductive material, for example copper alloy, so that it can electrically connect both of the ball-bonded ends of the screening bonding wire. It is also possible to connect both ball-bonded ends of the screening bonding wire by using a metal layer, for example a gold plate or strip to improve an electrical conductivity.

Figure 8B:
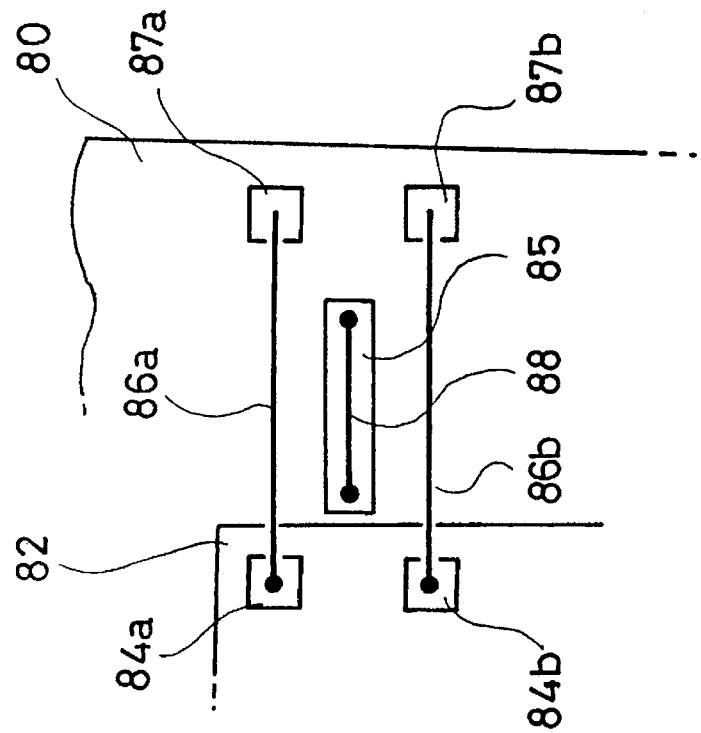
FIG. 8B is a plan view thereof.
Figure 8A:
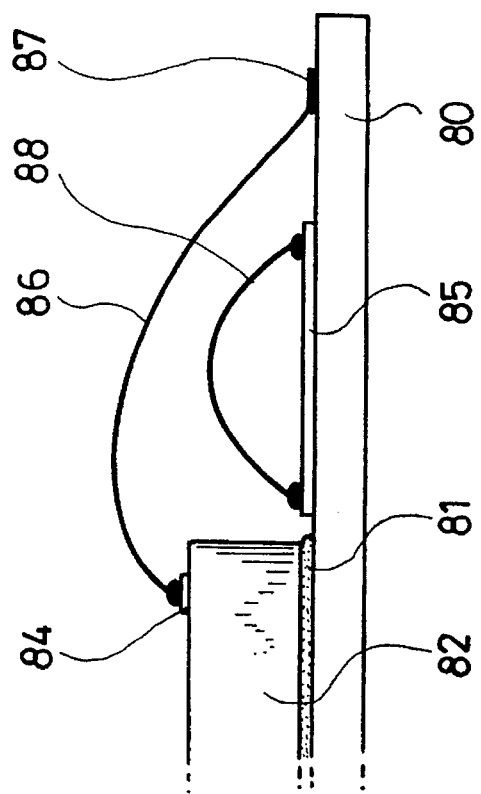
FIG. 8A is a partial cross-sectional view of another embodiment of a semiconductor device package with a screening bonding wire according to the present invention, in which the chip supporting means is not a ground plane.

FIG. 8A is a partial cross-sectional view of another embodiment of a semiconductor device package provided with screening bonding wires according to the present invention, in which the chip supporting means is not a grounded plane, and FIG. 8B is a plan view thereof. FIG. 8 is an embodiment of the semiconductor chip package in which the chip supporting means is a PCB (Printed Circuit Board), while FIG. 7 depicts a package in which the chip-mounting means is a lead frame pad, a grounded plane.

The substrate (80) is comprised of a chip-mounting area onto which the chip (82) is attached, pads (87) to which bonding wires are bonded, and wires (not shown) for electrically connecting the chip (82) to the bonding pads (84). The chip (82) is attached onto the substrate (80) by way of an adhesive (81). The bonding pads (84a, 84b) of the chip (82) are connected to the pads (87a, 87b) of the substrate (80) by way of bonding wires (86a, 86b). A screening bonding wire (88) is provided between the bonding wires (86a, 86b) on a metal layer (85) formed onto the non-conductive substrate (80).

In FIGS. 7 and 8, the screening bonding wires (78, 88) preferably have a identical or similar height and shape to that of the bonding wires (76a, 76b, 86a, 86b). Further, the screening bonding wires (78, 88) are made from a same material as that of the bonding wires (76a, 76b, 86a, 86b).

The bonding wires can be lineated into a vertical and slant components as shown in FIG. 2, and when the current through the bonding wires is divided into a vertical and horizontal components, the horizontal component is offset by an image bonding wire. Therefore, it is preferable to use a screening bonding wire of the same or similar shape as that of the bonding wire, to offset the magnetic field from the vertical current component.

Figure 9:
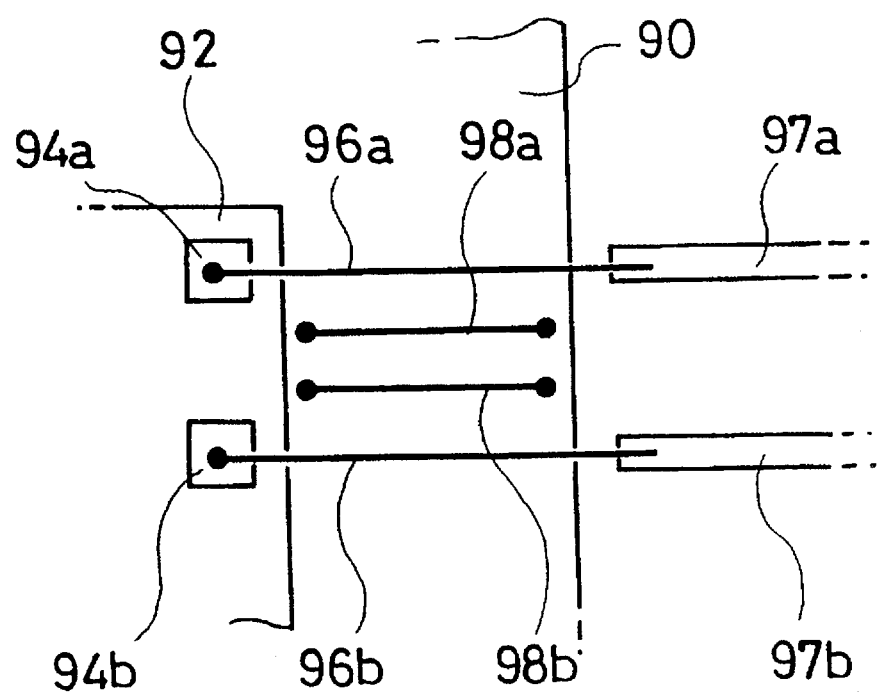
FIG. 9 is a partial plan view of semiconductor device package with two screening bonding wires provided according to the present invention.

FIG. 9 is a partial plan view of semiconductor device package provided with two screening bonding wires according to the present invention. For simplification, the package structure is designed almost the same as that shown in FIG. 7A. That is to say, a semiconductor chip (92) is attached onto a die pad (90) of a lead frame, and bonding pads (94a, 94b) formed on the upper surface of the chip (92) is connected to leads (97a, 97b) by way of bonding wires (96a, 96b). Two screening bonding wires (98a, 98b) are bonded onto the substrate (90) at both ends. If a sufficient space for providing screening bonding wires can be secured between the individual bonding wires, two screening bonding wires will be more effective to reduce mutual inductance and crosstalk level. For this case, it is preferred that the height and shape of the screening bonding wires (98a, 98b) be the substantially same or similar to those of the bonding wires (96a, 96b). This structure also can be applied to the semiconductor chip package using a PCB as shown in FIG. 8.

As is believed to be clearly apparent from the description above, the bonding wire structure for high-frequency and high-density integrated circuits according to the present invention can be fabricated using a conventional wire bonding process, and can significantly reduce the inductance and crosstalk level of bonding wires, so that bandwidth can be widened.

Although preferred embodiments of the present invention have been described in detail hereinabove, it should be clearly understood that many variations and/or modifications of the basic inventive concepts herein taught which may appear to those skilled in the art will yet fall within the spirit and scope of the present invention as defined in the appended claims.

For example, the above description is directed to a multiple bonding wire structure in which a plurality of bonding wires are connected to a single signal terminal, the formation of screening bonding wire can be applied to a single bonding wire structure as well. Further, the screening bonding wire can be connected to bonding pad on the chip, which is connected to a ground power of the die pad, at one end and to die pad at the other end. Moreover, three or more screening bonding wires can be provided between individual bonding wires.

What is claimed is:

1. A semiconductor device package comprising:

a semiconductor chip formed with a plurality of bonding pads, including at least two bonding pads to which signals are transmitted;

a substrate provided with a chip-supporting means and a plurality of conductive means for electrically connecting the chip to external devices;

a plurality of bonding wires for electrically connecting said bonding pads to said conductive means, including bonding wires for electrically connecting said bonding pads to corresponding ones of said conductive means; and a current looping means for screening magnetic fields generated from said bonding wires so that the magnetic fields cannot interfere each other, said current looping means being located between said bonding wires and bonded to said substrate at both ends.

2. The semiconductor device package of claim 1, wherein:

each said current looping means is a screening bonding wire made from a same material as that of said bonding wires.

3. The semiconductor device package of claim 2, wherein the height and shape of said screening wire are substantially identical to those of said bonding wires.

4. The semiconductor device package of claim 1, wherein:

said substrate is a lead frame, said chip-supporting means is a die pad, and said conductive means is a lead of the lead frame.

5. The semiconductor device package of claim 4, wherein:

said current looping means is bonded to an upper surface of said die pad at both ends and said die pad is grounded.

6. The semiconductor device package of claim 5, wherein:

said current looping means is a screening bonding wire made from a same material as that of said bonding wire, and is ball-bonded to said die pad at both ends.

7. The semiconductor device package of claim 6, wherein:

said bonding wires are wedge-bonded to said leads of said lead frame.

8. The semiconductor device package of claim 4, wherein:

the height and shape of said screening wire are substantially identical to those of said bonding wires.

9. The semiconductor device package of claim 1, wherein:

said substrate is a printed circuit board which comprised of pads to which said bonding wires are bonded and a chip-mounting area onto which the semiconductor chip is attached.

10. The semiconductor device package of claim 9, wherein:

said current looping means is bonded to an area surrounding said chip-mounting area at both ends and said both ends are electrically connected to each other by a metal layer formed onto the printed circuit board.

11. The semiconductor device package of claim 10, wherein:

said current looping means is a screening bonding wire made from a same material as that of said bonding wire, and is ball-bonded to said die pad at both ends.

12. The semiconductor device package of claim 11, wherein:

the height and shape of said screening wire are substantially identical to those of said bonding wires.

13. The semiconductor device package of claim 1 including:

at least two of said current looping means.

14. The semiconductor device package of claim 4, including:

at least comprises two of said current looping means.

15. The semiconductor device package of claim 9 including:

at least two of said current looping means.

16. The semiconductor device package of claim 1, which further comprises:

a current looping means provided between one said bonding wire and another said bonding wire.

17. The semiconductor device package of claim 4, which further comprises:

a current looping means provided between one said bonding wire and another said bonding wire.

18. The semiconductor device package of claim 9, which further comprises:

a current looping means provided between one said bonding wire and another said bonding wire.

19. The semiconductor device package of claim 4, wherein:

said lead frame is made from a copper alloy, and said current looping means is made from gold.

20. The semiconductor device package of claim 6, wherein:

said semiconductor chip further comprises a pad for bonding said screening bonding wire between said bonding pad, and said screening bonding wire is bonded to said pad at one end.

* * * * *